US012702008B2

(12) United States Patent
Kim et al.

(10) Patent No.: US 12,702,008 B2
(45) Date of Patent: Aug. 4, 2026

(54) SEMICONDUCTOR PACKAGE

(71) Applicant: Samsung Electronics Co., Ltd., Suwon-si (KR)

(72) Inventors: Jingu Kim, Suwon-si (KR); Taesung Jeong, Osan-si (KR); Doohwan Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 759 days.

(21) Appl. No.: 17/976,775

(22) Filed: Oct. 29, 2022

(65) Prior Publication Data

US 2023/0223353 A1    Jul. 13, 2023

(30) Foreign Application Priority Data

Jan. 11, 2022    (KR) ........................ 10-2022-0004297

(51) Int. Cl.

| | |
|---|---|
| *H01L 23/552* | (2006.01) |
| *H10W 42/20* | (2026.01) |
| *H10W 70/60* | (2026.01) |
| *H10W 70/685* | (2026.01) |
| *H10W 74/10* | (2026.01) |
| *H10W 90/00* | (2026.01) |
| *H10W 72/00* | (2026.01) |
| *H10W 72/20* | (2026.01) |
| *H10W 72/90* | (2026.01) |

(52) U.S. Cl.
CPC .......... *H10W 42/20* (2026.01); *H10W 70/611* (2026.01); *H10W 70/685* (2026.01); *H10W 74/114* (2026.01); *H10W 90/00* (2026.01);
*H10W 90/401* (2026.01); *H10W 90/701* (2026.01); *H10W 72/072* (2026.01); *H10W 72/252* (2026.01); *H10W 72/952* (2026.01); *H10W 90/724* (2026.01)

(58) Field of Classification Search
None
See application file for complete search history.

(56) References Cited

U.S. PATENT DOCUMENTS

| | | | |
|---|---|---|---|
| 8,178,953 B2 | 5/2012 | Barth et al. | |
| 8,581,370 B2* | 11/2013 | Pagaila | ............... H01L 23/3121 |
| | | | 257/659 |
| 8,587,096 B2* | 11/2013 | Kim | ...................... H01L 23/481 |
| | | | 257/659 |
| 10,276,542 B2* | 4/2019 | Huang | .................... H01L 25/50 |
| 10,304,790 B2 | 5/2019 | Chang et al. | |
| 10,438,899 B2* | 10/2019 | Kim | ...................... H01L 23/367 |
| 10,440,819 B2 | 10/2019 | Vincent | |

(Continued)

FOREIGN PATENT DOCUMENTS

| | | |
|---|---|---|
| KR | 1020190016338 A | 2/2019 |
| KR | 1020210131689 A | 11/2021 |

*Primary Examiner* — Long Pham
(74) *Attorney, Agent, or Firm* — Muir Patent Law, PLLC

(57) ABSTRACT

A semiconductor package includes: a first redistribution layer including a first wiring; a die located on the first redistribution layer; and a shielding structure surrounding the die from an upper surface and side surfaces of the die, wherein the shielding structure includes: a shielding wall that is spaced apart from the side surfaces of the die and surrounds the side surfaces of the die; and a shielding cover that is spaced apart from the upper surface of the die and surrounds the upper surface of the die.

19 Claims, 15 Drawing Sheets

(56)  References Cited

U.S. PATENT DOCUMENTS

| | | | |
|---|---|---|---|
| 11,031,352 | B2 | 6/2021 | Yu et al. |
| 11,037,884 | B2 | 6/2021 | Seo et al. |
| 11,043,731 | B2 | 6/2021 | Chuang et al. |
| 11,139,252 | B2 * | 10/2021 | Fang .................... H01L 23/367 |
| 2019/0051612 | A1 * | 2/2019 | Kim ...................... H01L 23/367 |
| 2019/0214367 | A1 * | 7/2019 | Chen .................... H01L 23/552 |
| 2021/0335733 | A1 | 10/2021 | Hong et al. |
| 2023/0216201 | A1 * | 7/2023 | Lee .................... H01L 23/3128 |
| | | | 257/659 |

* cited by examiner 310            200            500    400

SEMICONDUCTOR PACKAGE

CROSS-REFERENCE TO RELATED APPLICATION

This application is based on and claims priority under 35 U.S.C. § 119 to Korean Patent Application No. 10-2022-0004297, filed on Jan. 11, 2022, in the Korean Intellectual Property Office, the disclosure of which is incorporated by reference herein in its entirety.

BACKGROUND

The inventive concept relates to a semiconductor package.

The changes in mobile devices and the development of information technology are leading to high-density and multi-functional circuits in electronic devices. Also, as the operating frequency is increased to a high frequency band, malfunction and degradation in signal quality are caused due to electromagnetic wave interference, noise, etc. As a result, the significance of electromagnetic wave interference shielding technology is increasing, and various techniques for forming an electromagnetic wave shielding layer at the semiconductor package level are under development.

SUMMARY

The inventive concept provides a semiconductor package which may be formed without an additional process in a redistribution layer forming process.

According to an aspect of the inventive concept, there is provided a semiconductor package including: a first redistribution layer including a first wiring; a die located on the first redistribution layer; and a shielding structure surrounding an upper surface and side surfaces of the die, wherein the shielding structure includes: a shielding wall that is spaced apart from the side surfaces of the die and surrounds the side surfaces of the die; and a shielding cover that is spaced apart from the upper surface of the die and surrounds the upper surface of the die.

According to an aspect of the inventive concept, there is provided a semiconductor package including: a redistribution layer; a plurality of dies located on the redistribution layer and including a first die and a second die; and a shielding structure surrounding at least one of the plurality of dies from an upper surface and side surfaces of the at least one of the plurality of dies, wherein the shielding structure includes: a first shielding wall that is spaced apart from side surfaces of at least a first one of the plurality of dies and surrounds the side surfaces of the at least the first one of the plurality of dies; and a shielding cover that is spaced apart from an upper surface of at least a second one of the plurality of dies and surrounds an upper surface of the at least the second one of the plurality of dies.

According to an aspect of the inventive concept, there is provided a semiconductor package including: a first redistribution layer including a first wiring; a die located on the first redistribution layer; a bump located between the first redistribution layer and the die and electrically connecting the die to the first wiring; a shielding structure including a shielding wall that is spaced apart from side surfaces of the die and surrounds four sides of the die and a shielding cover which is spaced apart from an upper surface of the die and also surrounds the upper surface of the die, and has a flat upper surface or lower surface, the shielding structure surrounding the die from the upper surface and the side surfaces of the die; a plurality of posts located on the first redistribution layer and outside the shielding wall to be spaced apart from the shielding structure, the plurality of posts being electrically connected to the first wiring; a molding member surrounding the die, the shielding wall, and the plurality of posts, and filling a space between the die, the shielding wall, and the plurality of posts; a second redistribution layer which is located on the shielding wall, the shielding cover, and the plurality of posts, includes a second wiring, and is electrically connected to the shielding wall and the plurality of posts through the second wiring; and an external connection terminal attached below the first redistribution layer.

BRIEF DESCRIPTION OF THE DRAWINGS

Embodiments of the inventive concept will be more clearly understood from the following detailed description taken in conjunction with the accompanying drawings in which:

FIG. 3 is a cross-sectional view of a semiconductor package, according to example embodiments of the inventive concept;

FIG. 8 is a cross-sectional view of a semiconductor package, according to example embodiments of the inventive concept;

DETAILED DESCRIPTION OF THE EMBODIMENTS

Figure 1:
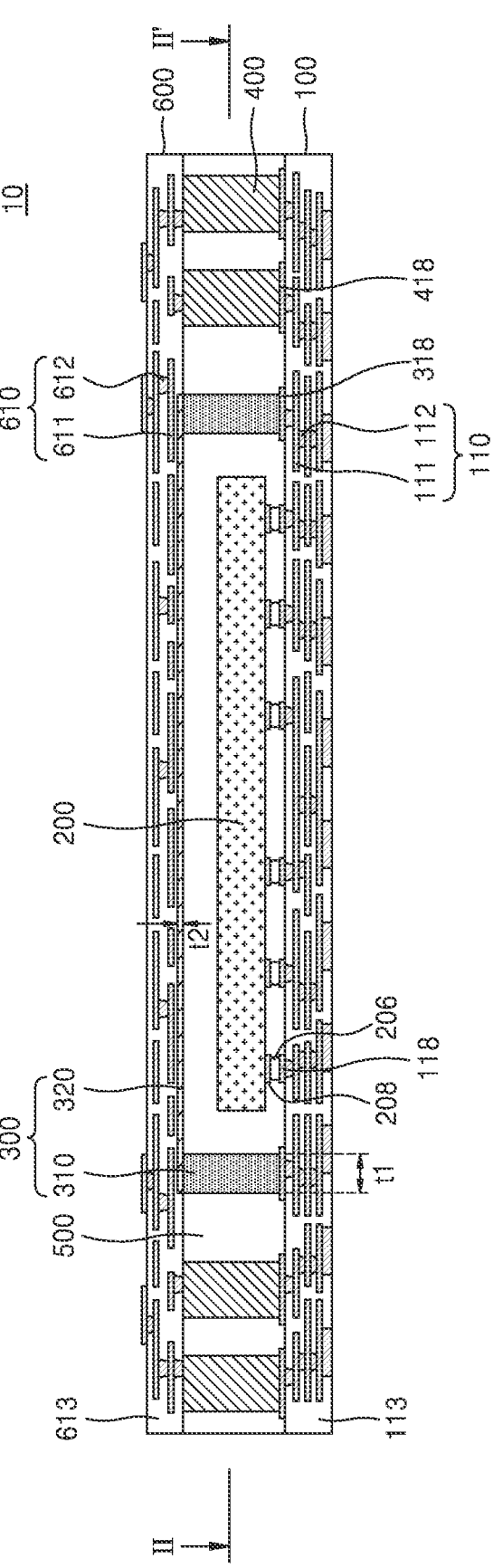
FIG. 1 is a cross-sectional view of a semiconductor package, according to example embodiments of the inventive concept.

Hereinafter, embodiments of the inventive concept will be described more fully with reference to the accompanying drawings. In the drawings, like elements are labeled with like reference numerals and repeated description thereof will be omitted.

FIG. 1 is a cross-sectional view of a semiconductor package 10 according to example embodiments of the inventive concept.

Referring to FIG. 1, the semiconductor package 10 may include a first redistribution layer 100 including a first wiring 110, a die 200 located on the first redistribution layer 100, and a shielding structure 300 surrounding the die 200 from upper and side surfaces thereof, wherein the shielding structure 300 may include a shielding wall 310 that is spaced apart from the side surfaces of the die 200 and surrounds the side surfaces of the die 200, and a shielding cover 320 that is spaced apart from the upper surface of the die 200 and surrounds the upper surface of the die 200. In example embodiments, when viewed in plan view, the shielding cover 320 may have an area greater than an area of the upper surfaces of the die 200.

The first redistribution layer 100 may include the first wiring 110 including a first wiring pattern 111 and a first wiring via 112, and a first redistribution insulating layer 113. In some embodiments, a plurality of first redistribution insulating layers 113 may be stacked. The first redistribution insulating layer 113 may include, for example, a photo imageable dielectric (PID) or photosensitive polyimide (PSPI). The first wiring pattern 111 and the first wiring via 112 may include, for example, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof, but embodiments are not limited thereto. In some embodiments, the first wiring pattern 111 and the first wiring via 112 may be formed by stacking a metal or an alloy of a metal on a seed layer including titanium, titanium nitride, or titanium tungsten.

The first wiring pattern 111 may be arranged on at least one of an upper surface and a lower surface of the first redistribution insulating layer 113. The first wiring via 112 may pass through the first redistribution insulating layer 113 to contact and be connected to some of the first wiring patterns 111. In some embodiments, at least some of the first wiring patterns 111 may be formed together with some of the first wiring vias 112 and may form a single body. For example, the first wiring pattern 111 and the first wiring via 112 that is in contact with a lower surface of the first wiring pattern 111 may form a single body. The first redistribution insulating layer 113 may surround the first wiring pattern 111 and the first wiring via 112.

The die 200 may include a logic chip or a memory chip. The logic chip may include, for example, a memory controller chip, a central processing unit (CPU) chip, a graphics processing unit (GPU) chip, or an application processor (AP) chip. The memory chip may include, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The die 200 may be connected to the first wiring 110 by a bump 206. In detail, the die 200 may include a die pad 208 at a position corresponding to the bump 206, and the bump 206 may be provided on the die pad 208. Each of the bump 206 and the die pad 208 may be provided in plural. The bump 206 may include tin (Sn) as a main component, and may further include a metal, such as copper (Cu), silver (Ag), gold (Au), tungsten (W), bismuth (Bi), zirconium (Zr), zinc (Zn), cobalt (Co), nickel (Ni), or the like.

The die pad 208 may include any conductor, for example, may include an alloy further including Cu, Ni, W, Ti, Co, or Fe. In example embodiments, the die pad 208 may be provided on a lower surface of the die 200.

In some embodiments, first redistribution upper pads 118 may be further provided on the first redistribution layer 100 at positions corresponding to the bumps 206. The first redistribution upper pads 118 may include any conductor, for example, may include an alloy further including Cu, Ni, W, Ti, Co, or Fe. In particular, the first redistribution upper pads 118 may protrude from an upper surface of the first redistribution layer 100.

The shielding structure 300 may include the shielding wall 310 that is spaced apart from the side surfaces of the die 200 and surrounds the side surfaces of the die 200, and the shielding cover 320 that is spaced apart from the upper surface of the die 200 and surrounds the upper surface of the die 200.

The shielding wall 310 may surround the side surfaces of the die 200. One end of the shielding wall 310 may be in contact with the first redistribution layer 100, and the other end of the shielding wall 310 may be in contact with the shielding cover 320. In some embodiments, lower and upper ends of the shielding wall 310 may be in direct contact with the first redistribution layer 100 and the shielding cover 320, respectively. The shielding wall 310 may include a conductive material, such as copper (Cu), nickel (Ni), silver (Ag), gold (Au), iron (Fe), or a combination thereof. The shielding wall 310 may have a first thickness t1 in a direction parallel to the first redistribution layer 100. The first thickness t1 may be, for example, about 10 μm to about 500 μm.

In some embodiments, the shielding wall 310 may be arranged on the first redistribution layer 100 with a second redistribution upper pad 318 therebetween. In this case, one end of the shielding wall 310 may be in contact with the second redistribution upper pad 318, and the other end of the shielding wall 310 may be in contact with the shielding cover 320. For example, lower and upper ends of the shielding wall 310 may be in direct contact with the second redistribution upper pad 318 and the shielding cover 320, respectively. The second redistribution upper pad 318 may include any conductor, for example, may include an alloy further including Cu, Ni, W, Ti, Co, or Fe. In particular, the second redistribution upper pad 318 may protrude from the upper surface of the first redistribution layer 100.

The shielding cover 320 may be in contact with the shielding wall 310. For example, a portion of a lower surface of the shielding cover 320 may be in direct contact with at least a portion of an upper surface of the shielding wall 310. The shielding cover 320 may include a conductive material, such as copper (Cu), nickel (Ni), silver (Ag), gold (Au), iron (Fe), or a combination thereof. In some embodiments, the shielding cover 320 may include a conductive material formed by performing a sputtering process. In some other embodiments, the shielding cover 320 may include a different material from that of the shielding wall 310. For example, the shielding wall 310 may include copper (Cu), and the shielding cover 320 may include electromagnetic wave-absorbing tape. The shielding cover 320 may have a second thickness t2 in a direction perpendicular to the first redistribution layer 100. In some embodiments, the first thickness t1 of the shielding wall 310 may be different from the second thickness t2 of the shielding cover 320. In detail, the first thickness t1 of the shielding wall 310 may be greater than the second thickness t2 of the shielding cover 320.

In some embodiments, the semiconductor package 10 may further include a plurality of posts 400 that are located outside the shielding wall 310 on the first redistribution layer 100 and electrically connected to the first wiring 110. The plurality of posts 400 may electrically connect the first wiring 110 and a second wiring 610 to each other to transmit an electrical signal therebetween.

The plurality of posts 400 may each have a cylindrical shape or a square pillar shape. In other embodiments, some of the plurality of posts 400 may have a cylindrical shape, and some others thereof may have a square pillar shape.

In some embodiments, the posts 400 may be arranged on the first redistribution layer 100 with a third redistribution upper pad 418 therebetween. For example, bottom surfaces of the posts 400 may directly contact upper surfaces of the third redistribution upper pads 418, respectively. The third redistribution upper pad 418 may include a conductor, for example, may include an alloy further including Cu, Ni, W, Ti, Co, or Fe. In particular, the third redistribution upper pad 418 may protrude from the upper surface of the first redistribution layer 100. For example, the third redistribution upper pads 418 may be provided on an upper surface of the first redistribution insulating layer 113 included in the first redistribution layer 100.

In some embodiments, the shielding wall 310 may be located between the die 200 and the plurality of posts 400 and spaced apart from the die 200 and the plurality of posts 400. For example, the shielding wall 310 may be located across each of spaces in which the die 200 and the plurality of posts 400 are located, respectively, to thereby separate the two spaces from each other.

In some embodiments, a vertical level of the upper surface of the shielding wall 310 may be higher than a vertical level of the upper surface of the die 200 and equal to a vertical level of the plurality of posts 400. For example, by making the vertical level of the upper surface of the shielding wall 310 higher than the vertical level of the upper surface of the die 200, the shielding wall 310 may completely surround the side surfaces of the die 200, and the shielding cover 320 located on the shielding wall 310 may be spaced apart from the upper surface of the die 200.

In some embodiments, at least one of the shielding wall 310, the shielding cover 320, and the plurality of posts 400 may include copper. The shielding wall 310 and the plurality of posts 400 may be formed by performing a plating process, such as an electroplating process or an electroless plating process. In some embodiments, the shielding wall 310 and/or the plurality of posts 400 may be formed by an electroless plating process, and in this case, the second redistribution upper pad 318 and/or the third redistribution upper pad 418 may be omitted.

The shielding cover 320 may be formed by performing a sputtering process. The plating process and the sputtering process for forming the shielding wall 310 and the plurality of posts 400 may be performed together with some processes of a redistribution layer (RDL) forming process, that is, a process of forming the first redistribution layer 100 and a second redistribution layer 600. However, the inventive concept is not limited thereto.

In some embodiments, a plating process of forming the shielding wall 310 may be performed around a region where the die 200 is to be bonded on the first redistribution layer 100. For example, the shielding wall 310 may be first formed through a plating process for forming the shielding wall 310 before a die bonding process of the die 200. The plating process for forming the shielding wall 310 may be performed simultaneously with a plating process for forming the plurality of posts 400. For example, the shielding wall 310 and the plurality of posts 400 may include the same material as each other.

In some embodiments, the semiconductor package 10 may further include a molding member 500 on the first redistribution layer 100, which covers an upper surface of the first redistribution layer 100, surrounds the die 200, the shielding wall 310, and the plurality of posts 400, and fills spaces between the die 200, the shielding wall 310, and the plurality of posts 400.

The molding member 500 may include a thermosetting resin, a thermoplastic resin, a UV curable resin, or a combination thereof. The molding member 500 may include, for example, an epoxy resin, a silicone resin, or a combination thereof. The molding member 500 may include, for example, an epoxy mold compound (EMC). However, the inventive concept is not limited thereto.

In some embodiments, upper surfaces of the shielding wall 310, the plurality of posts 400, and the molding member 500 may be coplanar with each other. By configuring the upper surfaces of the shielding wall 310, the plurality of posts 400, and the molding member 500 to be coplanar with each other, other structures may be located flatly on upper surfaces of the shielding wall 310, the plurality of posts 400, and the molding member 500. In detail, after forming the shielding wall 310, the plurality of posts 400, and the molding member 500, a grinding process may be formed such that the upper surfaces of the shielding wall 310, the plurality of posts 400, and the molding member 500 are located on the same plane.

As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In some embodiments, a sputtering process for forming the shielding cover 320 may be performed on the upper surfaces of the shielding wall 310 and the molding member 500 after the grinding process of the shielding wall 310, the plurality of posts 400, and the molding member 500. For example, the shielding cover 320 may be formed by depositing a material, such as copper, by using a sputtering process, on the upper surface of the shielding wall 310 and the upper surface of the molding member 500 on the die 200.

In some embodiments, the semiconductor package 10 may further include the second redistribution layer 600 that is located on the shielding wall 310, the shielding cover 320, and the plurality of posts 400, and includes the second wiring 610 that is electrically connected to the shielding wall 310 and the plurality of posts 400.

The second redistribution layer 600 may include the second wiring 610 and a second redistribution insulating layer 613, the second wiring 610 including a second wiring pattern 611 and a second wiring via 612. In some embodiments, a plurality of second redistribution insulating layers 613 may be stacked. The second redistribution insulating layer 613 may be formed of, for example, a PID or PSPI. The second wiring pattern 611 and the second wiring via 612 may include, for example, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc. or an alloy thereof, but is not limited thereto. In some embodiments, the second wiring pattern 611 and the second wiring via 612 may be formed by stacking a metal or an alloy of a metal on a seed layer including titanium, titanium nitride, or titanium tungsten.

The second wiring pattern 611 may be arranged on at least one of an upper surface and a lower surface of the second redistribution insulating layer 613. The second wiring via 612 may pass through the second redistribution insulating layer 613 to contact and be connected to some of the second wiring patterns 611. In some embodiments, at least some of the second wiring patterns 611 may be formed together with some of the second wiring vias 612 to form a single body. For example, the second wiring pattern 611 and the second wiring via 612 that is in contact with a lower surface of the second wiring pattern 611 may form a single body. The second redistribution insulating layer 613 may surround the second wiring pattern 611 and the second wiring via 612.

In some embodiments, the die 200 inside the shielding structure 300 may be shielded from electromagnetic waves coming from the side surfaces and the upper surface thereof through the shielding structure 300. For example, the die 200 inside the shielding structure 300 may be shielded, through the shielding wall 310, from electromagnetic waves coming from the side surfaces of the die 200. In addition, the die 200 inside the shielding structure 300 may be shielded, through the shielding cover 320, from electromagnetic waves coming from the upper surface of the die 200.

In some embodiments, heat generated from the die 200 inside the shielding structure 300 may be effectively dissipated to the side and upper surfaces thereof, through the shielding structure 300. The heat in the die 200 inside the shielding structure 300 may be effectively dissipated to the side surfaces of the die 200, through the shielding wall 310. In addition, heat in the die 200 inside the shielding structure 300 may be effectively dissipated to the upper surface of the die 200, through the shielding cover 320. For example, the thermal dissipation of the semiconductor package 10 may be increased through the shielding structure 300.

In some embodiments, the shielding structure 300 may include a material having a higher thermal conductivity than the die 200. The shielding structure 300 may effectively dissipate heat generated from the die 200 through the side surfaces and the upper surface thereof. For example, the thermal conductivity of the die 200 may be about 100 W/mK to about 150 W/mK, and the thermal conductivity of the shielding structure 300 may be 300 W/mK or more. For example, the shielding structure 300 may include a metal having good thermal conductivity. However, when the shielding structure 300 includes a metal, a metal having a relatively small difference in a thermal expansion rate with the die 200 may be selected as a material of the shielding structure 300.

Figure 2:
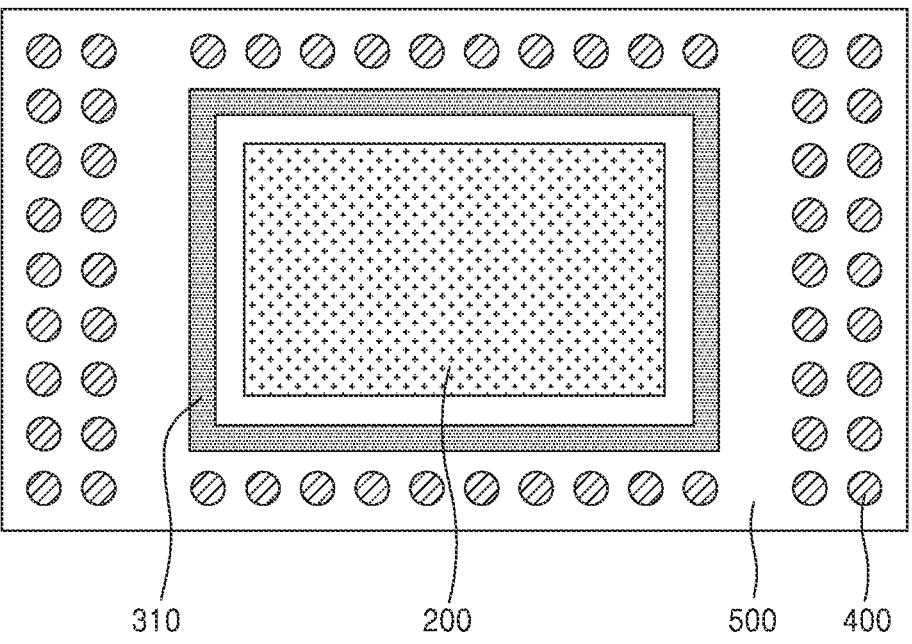
FIG. 2 is a cross-sectional view of a portion of the semiconductor package of FIG. 1 in a direction II-II'.

FIG. 2 is a cross-sectional view of a portion of the semiconductor package 10 of FIG. 1 in a direction II-II'.

Referring to FIG. 2, the shielding wall 310 may surround four sides of the die 200, and a shape thereof viewed from above may be a rectangular shape. For example, the shape of the die 200 viewed from above may be a rectangular shape, and the shielding wall 310 may surround all sides of the die 200. In example embodiments, a distance between a side surface of the die 200 and the inner side surface of the shielding wall 310 may be the same with respect to all side of the die 200. However, the inventive concept is not limited thereto, and the shielding wall 310 may have a polygonal shape or a curved shape.

In some embodiments, the shielding wall 310 may be spaced apart from the plurality of posts 400 and the die 200 in a horizontal direction. In addition, the plurality of posts 400 may be apart from each other in a horizontal direction. The die 200 may be located at any position on the first redistribution layer 100, and at a weight center or an edge portion of the first redistribution layer 100. In some embodiments, the die 200 may be located at a center portion of the first redistribution layer 100 in a plan view, and the shielding wall 310 may surround the die 200, and the plurality of posts 400 may be arranged outside the shielding wall 310 surrounding the die 200.

Figure 3:
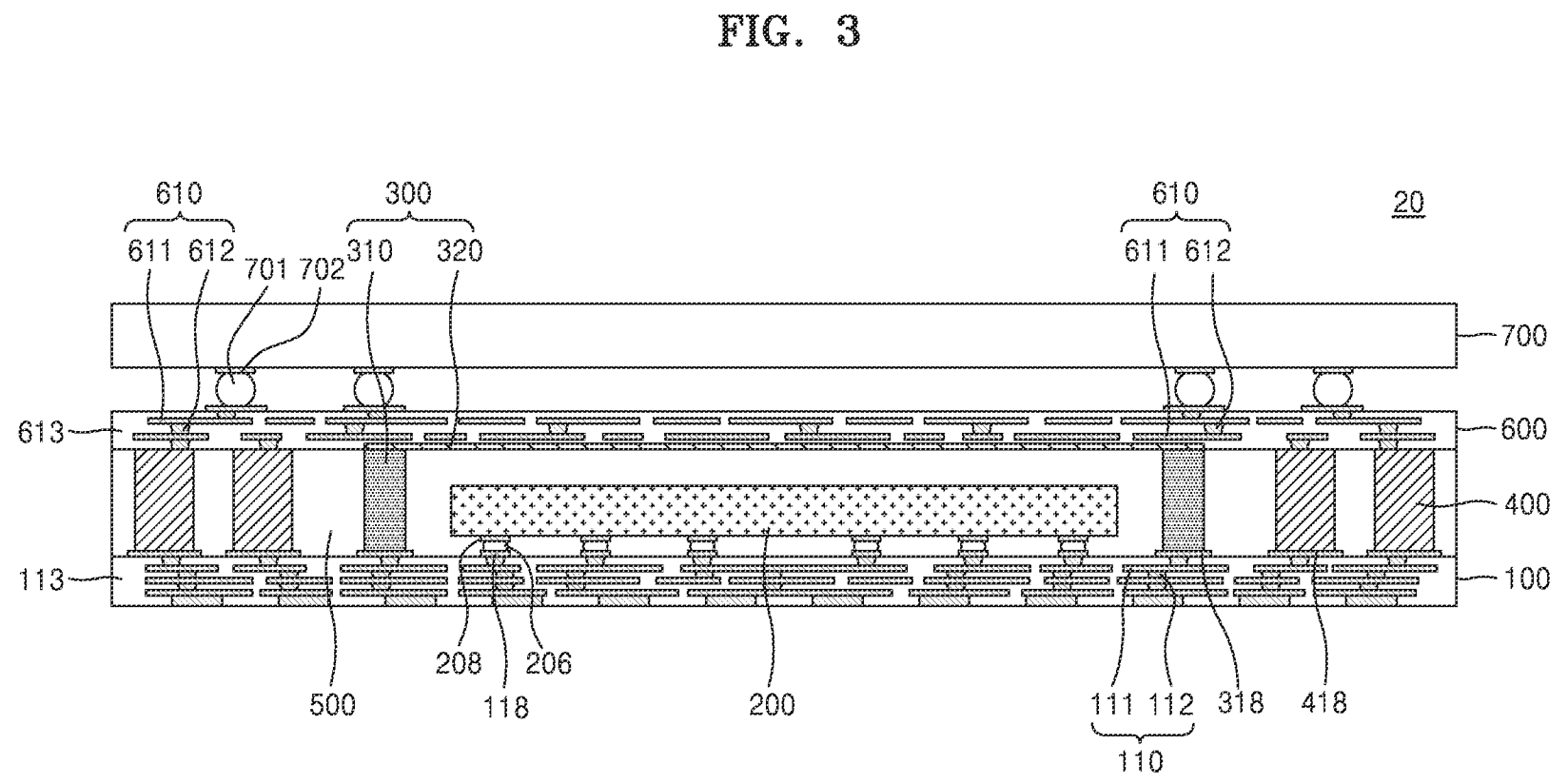

FIG. 3 is a cross-sectional view of a semiconductor package 20 according to example embodiments of the inventive concept.

Referring to FIG. 3, the semiconductor package 20 may include a top package 700 stacked on a bottom package. For example, the semiconductor package 20 may be a package-on-package (POP) type in which two or more packages are stacked in a vertical direction. The semiconductor package 20, which is a POP type, may include the bottom package and the top package 700 stacked on the bottom semiconductor package 10 and electrically connected to the bottom semiconductor package 10. The bottom semiconductor package 10 may include the first redistribution layer 100, the die 200, the shielding structure 300, the plurality of posts 400, the molding member 500, and the second redistribution layer 600. The bottom package is substantially the same as the semiconductor package 10 described with reference to FIG. 1, and thus, a detailed description thereof will be omitted. The top package 700 may include a semiconductor chip similar to the die 200, and the semiconductor chip may include a logic chip or a memory chip. The top package 700 may be located on the second redistribution layer 600 and may be electrically connected to the second redistribution layer 600. In some embodiments, the semiconductor package 20 may include an external connection terminal 701 electrically connecting the top package 700 and the bottom semiconductor package 10 to each other. The external connection terminal 701 may be located between a pad 702 located on a lower surface of the top package 700 and the second wiring 610 located on the upper surface of the second redistribution layer 600. The external connection terminal 701 may include gold (Au), copper (Cu), nickel (Ni), tin (Sn), lead (Pb), or a combination thereof. The external connection terminal 701 may be formed from, for example, a solder ball. In example embodiments, the external connection terminal 701 may be a plurality of external connection terminals 701.

Terms such as "same" or "equal," as used herein, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Figure 4A:
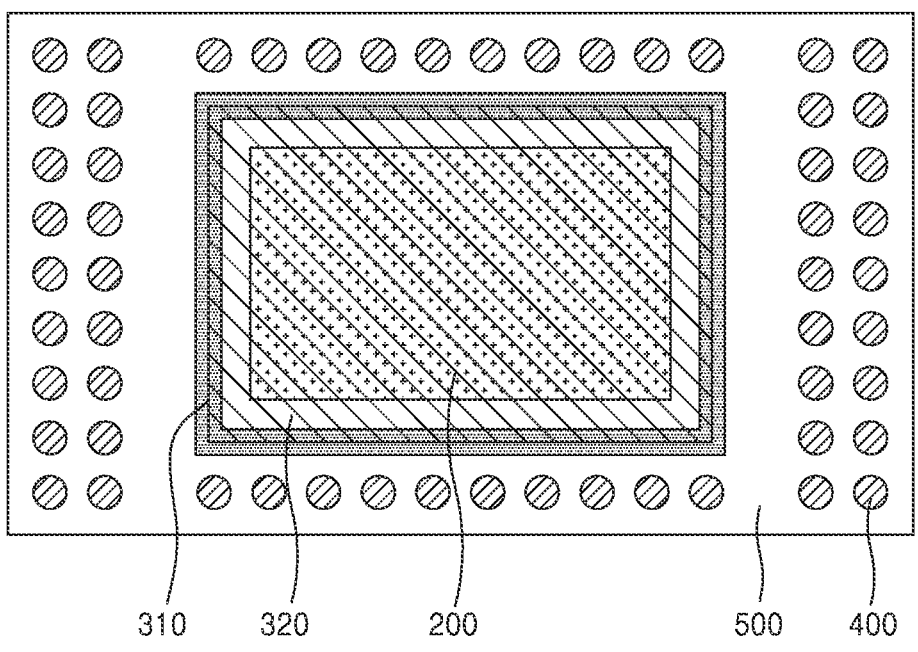
FIGS. 4A and 4B are plan views of a semiconductor package, according to example embodiments of the inventive concept.
Figure 4B:
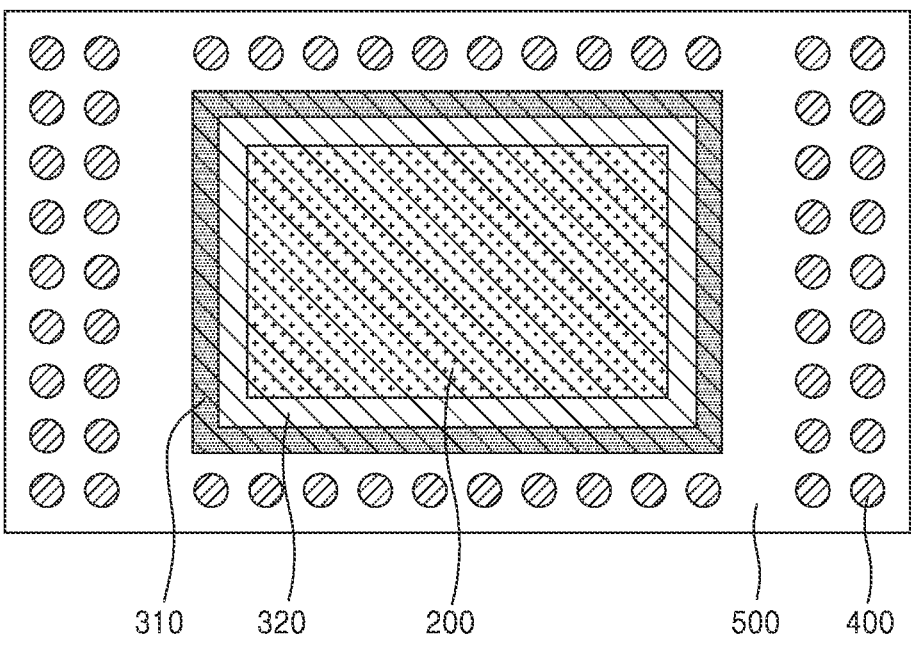

FIGS. 4A and 4B are plan views of the semiconductor package 10 according to example embodiments of the inventive concept.

Referring to FIGS. 4A and 4B, a space defined by the shielding wall 310 may completely overlap a horizontal cross-section of the shielding cover 320 in a vertical direction. A portion of the shielding cover 320 may be in contact with at least a portion of the upper surface of the shielding wall 310. In some embodiments, when a space defined by the shielding wall 310 is viewed from above, the shielding cover 320 may cover all of the defined space. Areas of an upper surface and the lower surface of the shielding cover 320 may be variously configured. For example, referring to FIG. 4A, the area of the upper and lower surfaces of the shielding cover 320 may be greater than an area of an interior portion of the shielding wall 310 when viewed from above, and less than an area of an exterior portion of the shielding wall 310 when viewed from above. For example, side surfaces of the shielding cover 320 may be between inner and outer side surfaces of the shielding wall 310. Also, referring to FIG. 4B, the areas of the upper and lower surfaces of the shielding cover 320 may be equal to or greater than the area of the exterior portion of the shielding wall 310 when viewed from above. For example, side surfaces of the shielding cover 320 may be vertically aligned with outer side surfaces of the shielding wall 310.

Figure 5:
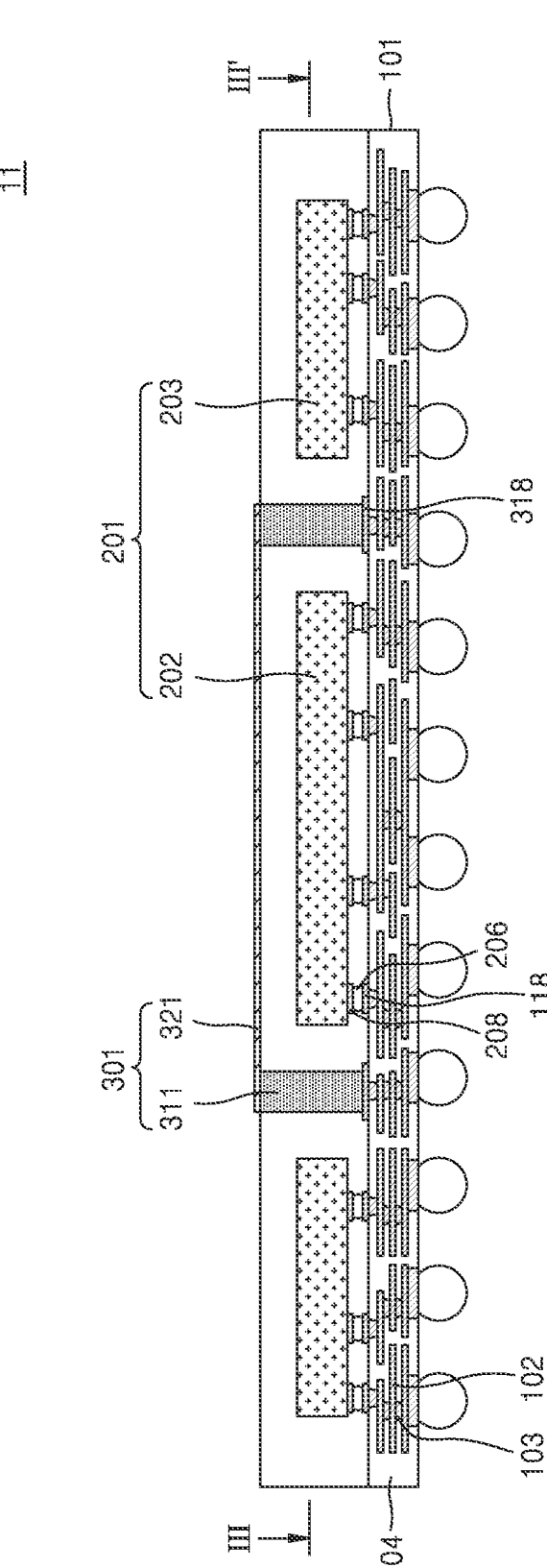
FIG. 5 is a cross-sectional view of a semiconductor package, according to example embodiments of the inventive concept.

FIG. 5 is a cross-sectional view of a semiconductor package 11 according to example embodiments of the inventive concept.

Referring to FIG. 5, the semiconductor package 11 may include a redistribution layer 101, a plurality of dies 201 which are arranged on the redistribution layer 101 and include a first die 202 and a second die 203, and a shielding structure 301 surrounding at least one of the plurality of dies 201 from upper and side surfaces of at least one of the plurality of dies 201, wherein the shielding structure 301 may include a first shielding wall 311 that is spaced apart from side surfaces of at least one of the plurality of dies 201 and surrounds the side surfaces of the at least one of the plurality of dies 201, and a shielding cover 321 that is spaced apart from an upper surface of at least one of the plurality of dies 201 and surrounds the upper surface of the at least one of the plurality of dies 201.

The redistribution layer 101 may include a wiring pattern 102, a wiring via 103, and a redistribution insulating layer 104. In some embodiments, a plurality of redistribution insulating layers 104 may be stacked. The wiring pattern 102, the wiring via 103, and the redistribution insulating layer 104 included in the redistribution layer 101 are substantially and respectively the same as the first wiring pattern 111, the first wiring via 112, and the first redistribution insulating layer 113 included in the first redistribution layer 100, and thus, repeated descriptions thereof may be omitted.

The plurality of dies 201 may include the first die 202 and the second die 203. The first die 202 and the second die 203 may be of different types. For example, the first die 202 may include a logic chip and the second die 203 may include a memory chip. However, the number and types of semiconductor chips included in the semiconductor package 11 are not limited thereto. For example, the second die 203 may be a plurality of second dies 203. As the first die 202 and the second die 203 included in the plurality of dies 201 are substantially the same as the die 200, repeated descriptions thereof may be omitted.

The first shielding wall 311 may be spaced apart from a side of at least one of the plurality of dies 201 and surround the side surfaces of the at least one of the plurality of dies 201. The shielding cover 321 may be spaced apart from an upper surface of at least one of the plurality of dies 201 and surround the upper surface of the at least one of the plurality of dies 201. For example, the first shielding wall 311 may surround only side surfaces of one of the plurality of dies 201. Also, the shielding cover 321 may surround only an upper surface of one of the plurality of dies 201. Also, the first shielding wall 311 may surround side surfaces of two or more of the plurality of dies 201. Also, the shielding cover 321 may surround upper surfaces of two or more of the plurality of dies 201. The first shielding wall 311 and the shielding cover 321 are substantially the same as the shielding wall 310 and the shielding cover 320, respectively, and thus repeated descriptions thereof may be omitted.

In some embodiments, the side and upper surfaces of the first die 202 may be surrounded by the first shielding wall 311 and the shielding cover 321 together. For example, when the first shielding wall 311 surrounds the side surfaces of the first die 202, the upper surface of the first die 202 may be surrounded by the shielding cover 321. Both the upper and side surfaces of the first die 202 on the redistribution layer 101 may be surrounded by the first shielding wall 311 and the shielding cover 321.

Although not separately illustrated, in some embodiments, the semiconductor package 11 may further include the second redistribution layer 600 illustrated in FIG. 1 or the second redistribution layer 600 and the top package 700 illustrated in FIG. 3.

Figure 6:
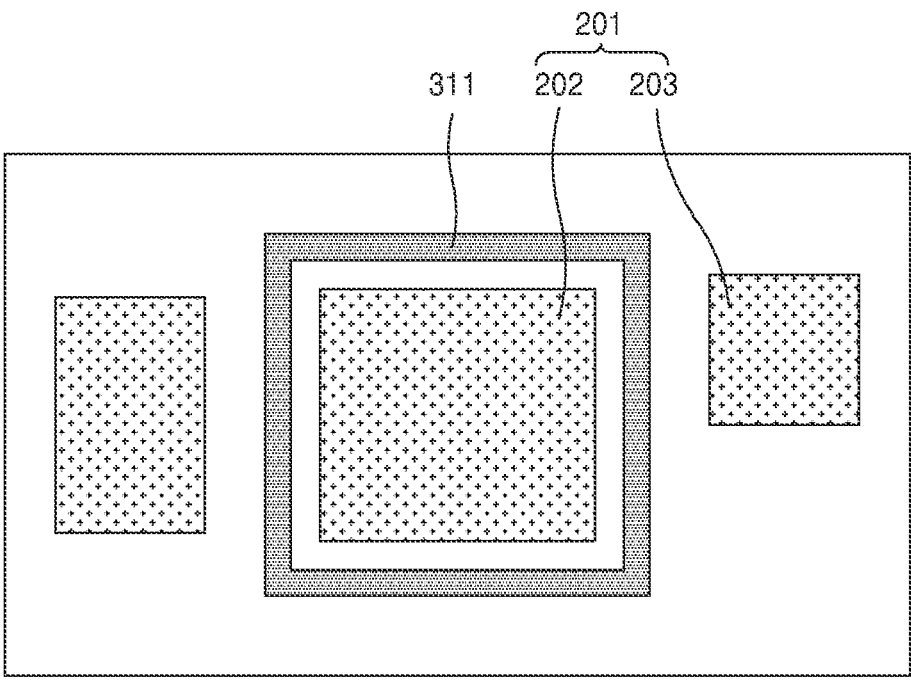
FIG. 6 is a cross-sectional view of a portion of the semiconductor package of FIG. 5 in a direction III-III'.

FIG. 6 is a cross-sectional view of a portion of the semiconductor package 11 of FIG. 5 in a direction III-III'.

Referring to FIG. 6, according to some embodiments, the plurality of dies 201 may be located on the redistribution layer 101. The first shielding wall 311 may surround four sides of at least one of the plurality of dies 201, and a shape thereof viewed from above may be a rectangular shape. For example, a shape of at least one of the plurality of dies 201 viewed from above may be a rectangular shape, and the first shielding wall 311 may surround all sides of the at least one of the plurality of dies 201. However, the inventive concept is not limited thereto, and the first shielding wall 311 may have a polygonal shape or a curved shape.

For example, four sides of the first die 202 among the plurality of dies 201 may be surrounded by the first shielding wall 311, and the second die 203 may be arranged outside the first shielding wall 311. The first shielding wall 311 may block interference due to electromagnetic waves between the first die 202 and the second die 203.

Figure 7:
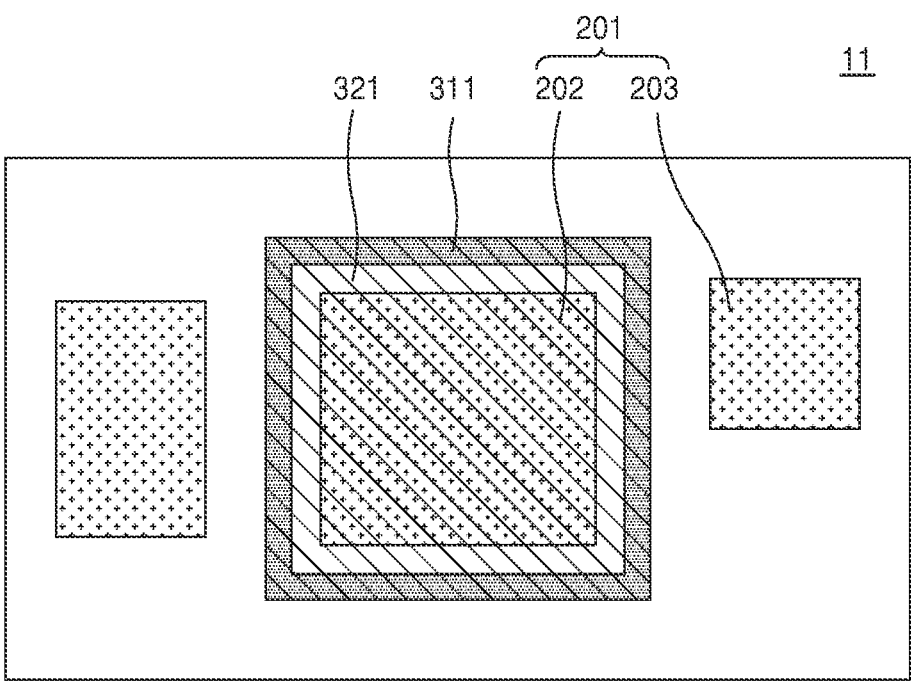
FIG. 7 is a plan view of a semiconductor package, according to example embodiments of the inventive concept.

FIG. 7 is a plan view of the semiconductor package 11 according to example embodiments of the inventive concept.

Referring to FIG. 7, a space defined by the first shielding wall 311 surrounding at least one of the plurality of dies 201 may completely overlap a horizontal cross-section of the shielding cover 321 in a vertical direction. In some embodiments, when a space defined by the first shielding wall 311 is viewed from above, the shielding cover 321 may cover all of the defined space. Areas of upper and lower surfaces of the shielding cover 321 may be variously configured. For example, similar to the shielding cover 320 and the shielding wall 310 illustrated in FIGS. 4A and 4B, the areas of the upper and lower surfaces of the shielding cover 321 may be less than, equal to, or greater than an area of an exterior portion of the first shielding wall 311 when viewed from above. However, the inventive concept is not limited thereto, and the shielding cover 321 may cover the first die 202 or the second die 203.

Figure 8:
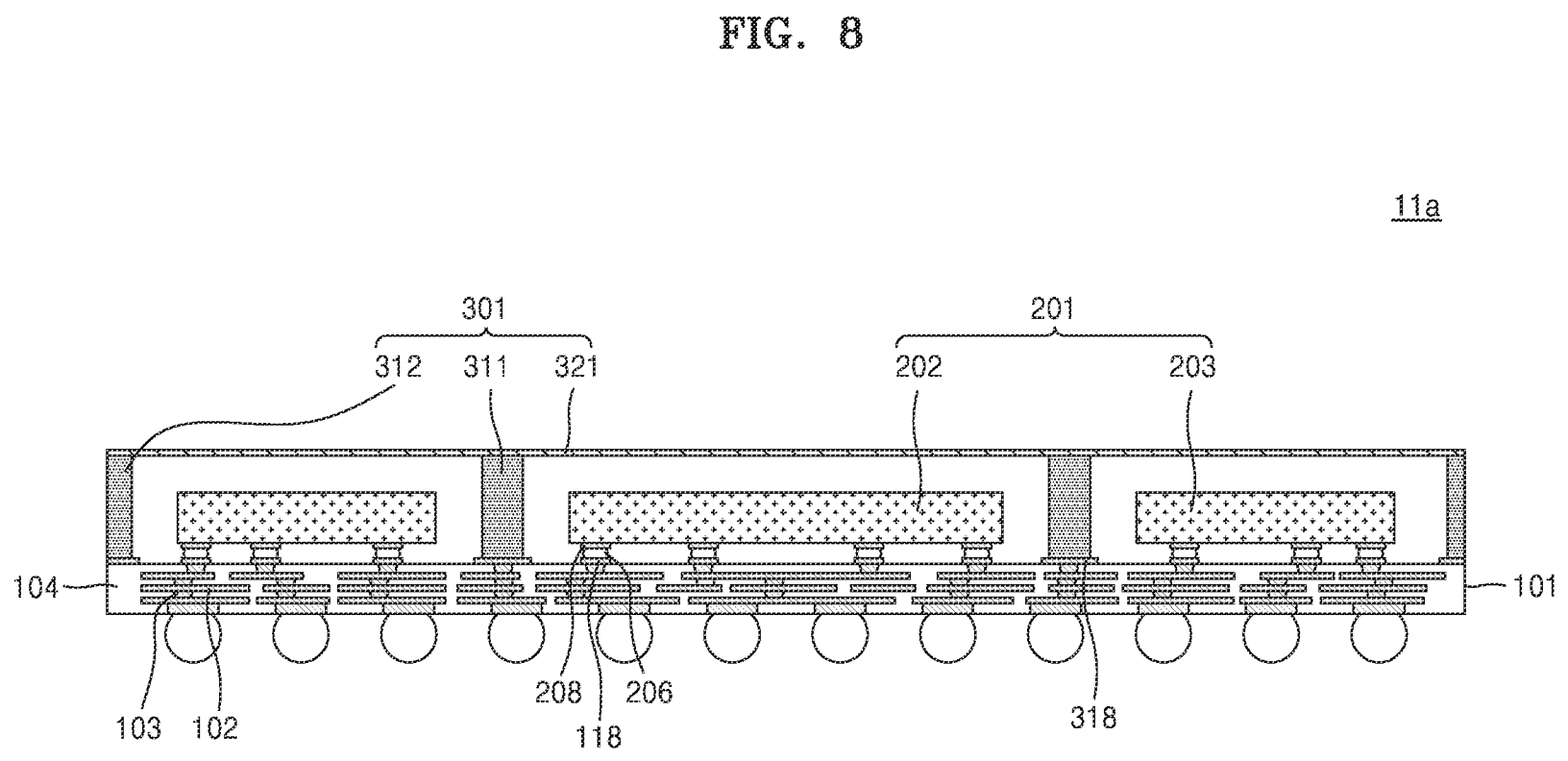

FIG. 8 is a cross-sectional view of a semiconductor package 11a according to example embodiments of the inventive concept.

Referring to FIG. 8, the second die 203 may be located outside the first shielding wall 311. For example, the plurality of dies 201 may be divided into the first die 202 located within the first shielding wall 311 and the second die 203 located outside the first shielding wall 311. There may be a plurality of first dies 202 located within the first shielding wall 311. For example, the plurality of first dies 202 may be located to be horizontally spaced apart from each other within the first shielding wall 311. There may be a plurality of second dies 203 located outside the second shielding wall 312. For example, the plurality of second dies 203 may be located to be horizontally spaced apart from each other outside the first shielding wall 311.

In some embodiments, the shielding structure 301 may further include the second shielding wall 312 surrounding the first die 202, the first shielding wall 311, and the second die 203 together. For example, the second shielding wall 312 may surround sidewalls of the second die 203 that is outside the first shielding wall 311. One end of the second shielding wall 312 may be in contact with the redistribution layer 101, and the other end of the second shielding wall 312 may be in contact with the shielding cover 321. As another example embodiment, one end of the second shielding wall 312 may be in contact with a second redistribution upper pad 318 on the redistribution layer 101, and the other end of the second shielding wall 312 may be in contact with the shielding cover 321. The first shielding wall 311 and the second shielding wall 312 are substantially the same as the shielding wall 310 illustrated in FIG. 1, and thus repeated descriptions thereof may be omitted.

In some embodiments, the shielding cover 321 may surround upper surfaces of all of the first die 202, the second die 203, the first shielding wall 311, and the second shielding wall 312. For example, the shielding cover 321 may cover the upper surfaces of the first die 202 and the second die 203 and may be in contact with each of the first shielding wall 311 and the second shielding wall 312.

In some embodiments, the first die 202 and the second die 203 may be spaced apart from the first shielding wall 311 and the second shielding wall 312. For example, the first shielding wall 311 may be spaced apart from the first die 202 and the second die 203 to separate spaces in which the first die 202 and the second die 203 are located, respectively. Also, the second shielding wall 312 may be spaced apart from the outside of the second die 203.

Figure 9:
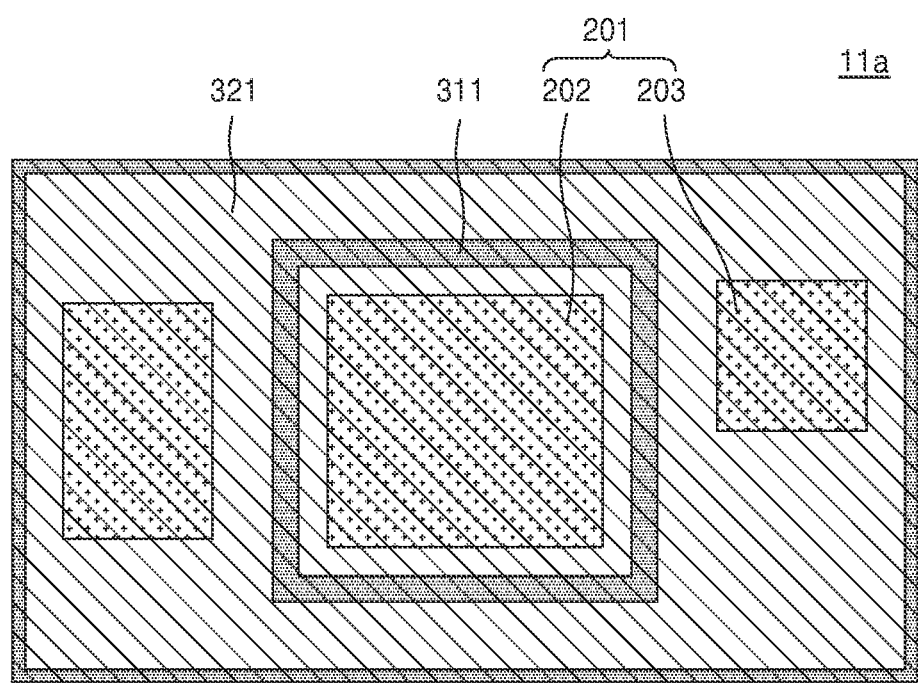
FIG. 9 is a plan view of a semiconductor package, according to example embodiments of the inventive concept.

FIG. 9 is a plan view of the semiconductor package 11a according to example embodiments of the inventive concept.

Referring to FIG. 9, at least one of the first die 202, the second dies 203, the first shielding wall 311, the second shielding wall 312, and the shielding cover 321 may have a rectangular shape. The second dies 203 may be located outside the first shielding wall 311, and may be located on the left and right sides of the first shielding wall 311 with respect to a shape viewed from above. However, the inventive concept is not limited thereto.

In some embodiments, a space defined by the second shielding wall 312 may totally overlap a horizontal cross-section of the shielding cover 321 in the vertical direction. FIG. 9 illustrates a state in which the shielding cover 321 surrounds all of the upper surfaces of the first die 202, the second dies 203, and the second shielding wall 312. For example, the areas of the upper surface and the lower surface of the shielding cover 321 may be less than, equal to, or greater than an area of a shape of an exterior portion of the second shielding wall 312 viewed from above.

Figure 10:
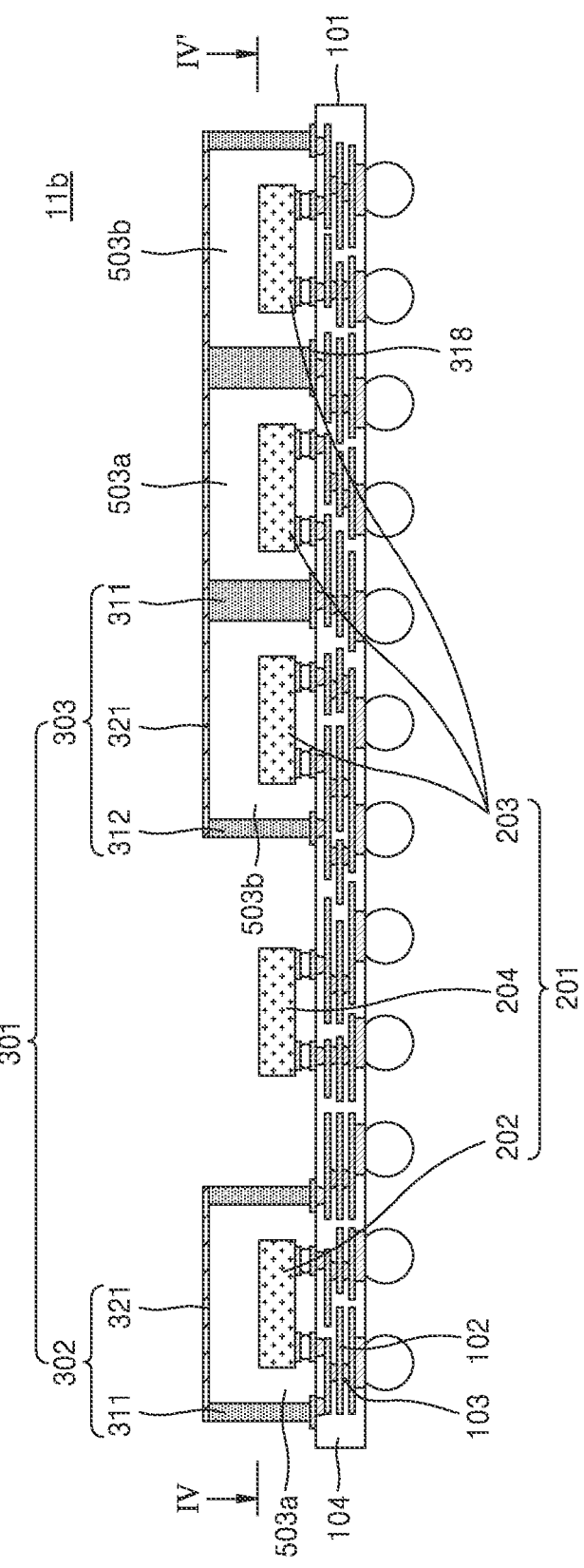
FIG. 10 is a cross-sectional view of a semiconductor package, according to example embodiments of the inventive concept.

FIG. 10 is a cross-sectional view of a semiconductor package 11b according to example embodiments of the inventive concept.

Figure 11:
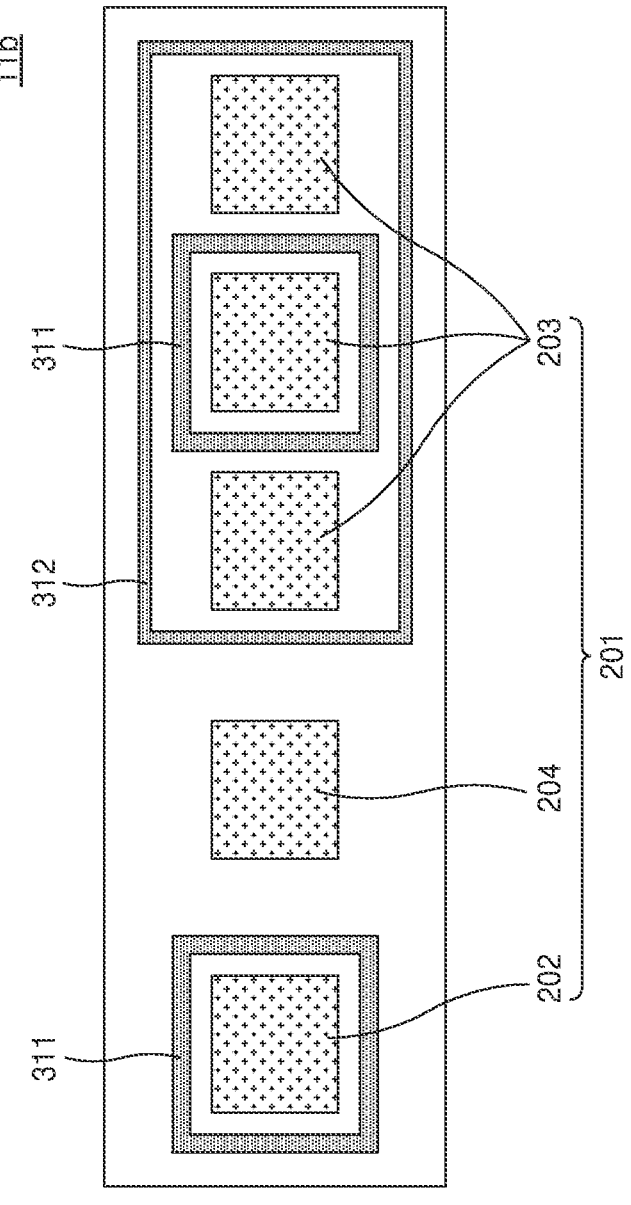
FIG. 11 is a cross-sectional view of a portion of the semiconductor package of FIG. 10 in a direction IV-IV'.

FIG. 11 is a cross-sectional view of the semiconductor package 11b in a direction IV-IV' of FIG. 10.

Referring to FIGS. 10 and 11, the semiconductor package 11b may include the redistribution layer 101, the plurality of dies 201, and the shielding structure 301 including the first shielding wall 311, the second shielding wall 312, and the shielding cover 321. The shielding structure 301 may include a first shielding structure 302 and a second shielding structure 303. For example, the shielding structure 301 may include a plurality of portions spaced apart from each other. For example, the first shielding structure 302 may include the first shielding wall 311 and the shielding cover 321 surrounding the one first die 202. In addition, the second shielding structure 303 may include the first shielding wall 311, the second shielding wall 312, and the shielding cover 321 surrounding a plurality of second dies 203.

In some embodiments, a space defined by the first shielding wall 311 and the shielding cover 321 may be filled by a first molding member 503a. In addition, a space defined by the first shielding wall 311, the second shielding wall 312, and the shielding cover 321 outside the first shielding wall 311 may be filled by a second molding member 503b. The first molding member 503a and the second molding member 503b may each independently include a thermosetting resin, a thermoplastic resin, a UV curable resin, or a combination thereof. The first molding member 503a and the second molding member 503b may each independently include, for example, an epoxy resin, a silicone resin, or a combination thereof. The first molding member 503a and the second molding member 503b may each independently include, for example, an EMC. However, the inventive concept is not limited thereto.

In addition, the first shielding structure 302 and the second shielding structure 303 may not surround a third die 204. For example, the third die 204 may be located outside the first shielding structure 302 and the second shielding structure 303. For example, the shielding structure 301 may be partially formed by selecting a die requiring electromagnetic wave shielding in the semiconductor package 11b. Although not illustrated in FIGS. 10 and 11, the semiconductor package 11b may further include the molding member 500, which covers an upper surface of the redistribution layer 101, on the redistribution layer 101, surrounds the plurality of dies 201, the first shielding wall 311, and the second shielding wall 312, and fills a space between the plurality of dies 201, the first shielding wall 311, and the second shielding wall 312.

Figure 12:
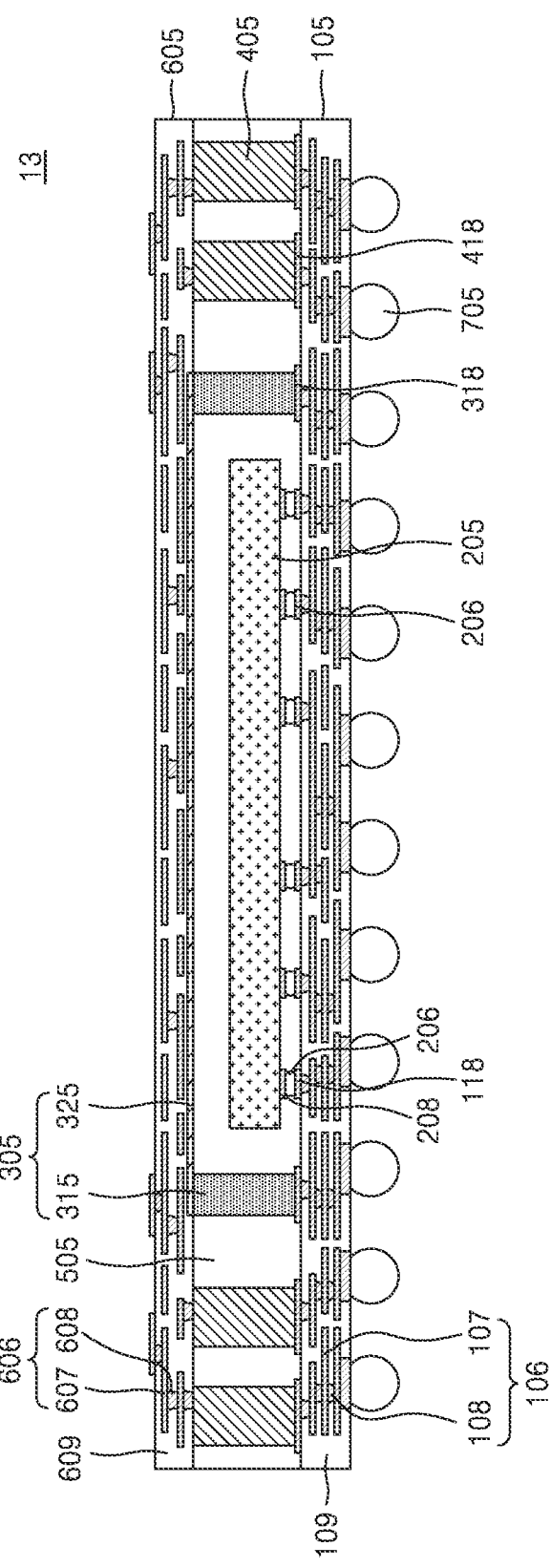
FIG. 12 is a cross-sectional view of a semiconductor package, according to example embodiments of the inventive concept.

FIG. 12 is a cross-sectional view of a semiconductor package 13 according to example embodiments of the inventive concept.

Referring to FIG. 12, the semiconductor package 13 may include a first redistribution layer 105 including a first wiring 106, a die 205 located on the first redistribution layer 105, a bump 206 that is located between the first redistribution layer 105 and the die 205 and electrically connects the die 205 to the first wiring 106, a shielding structure 305 including a shielding wall 315 that is spaced apart from side surfaces of the die 205 and surrounds four sides of the die 205 and a shielding cover 325 that is apart from an upper surface of the die 205 and also surrounds the upper surface of the die 205, and has flat upper and/or lower surfaces, a plurality of posts 405 that are located on the first redistribution layer 105 and outside the shielding wall 315 and spaced apart from the shielding structure 305 and electrically connected to the first wiring 106, a molding member 505, which surrounds the die 205, the shielding wall 315, and the plurality of posts 405 and fills a space between the die 205, the shielding wall 315, and the plurality of posts 405, a second redistribution layer 605 that is located on the shielding wall 315, the shielding cover 325, and the plurality of posts 405 and includes a second wiring 606, and is electrically connected to the shielding wall 315 and the plurality of posts 405 through the second wiring 606, and an external connection terminal 705 attached below the first redistribution layer 105.

The first redistribution layer 105 may include the first wiring 106 and a first redistribution insulating layer 109, the first wiring 106 including a first wiring pattern 107 and a first wiring via 108. In some embodiments, a plurality of first redistribution insulating layers 109 may be stacked. The first wiring pattern 107, the first wiring via 108, and the first redistribution insulating layer 109 included in the first redistribution layer 105 are substantially and respectively the same as the first wiring pattern 111, the first wiring via 112, and the first redistribution insulating layer 113 included in the first redistribution layer 100, and thus, repeated descriptions thereof may be omitted.

In some embodiments, the first redistribution layer 105 may be electrically connected to the plurality of posts 405, the bumps 206 electrically connecting the first redistribution layer 105 to the die 205 and the external connection terminals 705.

The bumps 206 may be located between the first redistribution layer 105 and the die 205 and may electrically connect the die 205 to the first wiring 106. For example, the die 205 may be bonded to the first redistribution layer 105 by a flip chip method. Being electrically connected to the first wiring 106 means being electrically connected to at least some of conductive members included in the first wiring 106, that is, at least some of the first wiring patterns 107 and the first wiring vias 108. Each of the bumps 206 may be electrically connected to one of the first wiring via 108 and the first wiring pattern 107. In some embodiments, each of the bumps 206 may be in contact with and electrically connected to the first wiring via 108 arranged on an upper surface of the first redistribution layer 105 among the first wiring vias 108, but is not limited thereto. In some other embodiments, some of the first wiring patterns 107 may be arranged on the upper surface of the first redistribution layer 105, and each of the bumps 206 may be in contact with and electrically connected to the first wiring pattern 107 arranged on the upper surface of the first redistribution layer 105, among the first wiring patterns 107. Each of the bumps 206 may have a height of, for example, about 15 μm to about 40 μm.

In some embodiments, a first redistribution upper pad 118 may be further provided on the first redistribution layer 105 at positions corresponding to the bumps 206. The first redistribution upper pads 118 may include any conductor, for example, may include an alloy further including Cu, Ni, W, Ti, Co, or Fe. In particular, the first redistribution upper pads 118 may protrude from an upper surface of the first redistribution layer 105.

The die 200 may be connected to the first wiring 106 by bumps 206. For example, the die 200 may include die pads 208 at positions corresponding to the bumps 206, and the bumps 206 may be provided on the die pads 208.

In some embodiments, when the die 205 and the first redistribution layer 105 are bonded to each other through the bump 206, an underfill process may be included. An underfill solution may be included to fill a gap between the die 205 and the first redistribution layer 105. The underfill solution may absorb impact applied to the bumps 206 and reduce tension.

In some embodiments, when the underfill solution is located between the die 205 and the first redistribution layer 105, and the underfill solution contacts the plurality of posts 405, the underfill solution may react with the plurality of posts 405, causing product defects. The shielding wall 315 may act as a dam to keep the underfill solution from contacting the plurality of posts 405.

The shielding structure 305 may be spaced apart from the side surfaces of the die 205, and include the shielding wall 315 surrounding the four sides of the die 205, and the shielding cover 325 that is apart from the upper surface of the die 205 and also surrounds the upper surface of the die 205, and has a flat upper surface or a lower surface to thereby surround the die 205 from the upper and side surfaces thereof.

The shielding wall 315 may surround the side surfaces of the die 205. One end of the shielding wall 315 may be in contact with the first redistribution layer 105, and the other end of the shielding wall 315 may be in contact with the shielding cover 325. The shielding wall 315 is substantially the same as the shielding wall 310 of FIG. 1, and thus, repeated description may be omitted.

The shielding cover 325 may be in contact with the shielding wall 315. As an upper surface or a lower surface of the shielding cover 325 is flat, when the shielding cover 325 is in contact with the shielding wall 315, all portions of the upper or lower surface of the shielding cover 325 may have a same vertical level. The shielding cover 325 is substantially the same as the shielding cover 320 of FIG. 1, and thus, repeated descriptions thereof may be omitted.

The plurality of posts 405 may be located above the first redistribution layer 105 and outside the shielding wall 315 to be spaced apart from the shielding structure 305, and may be electrically connected to the first wiring 106.

Each of the plurality of posts 405 may be in contact with and electrically connected to one of the first wiring via 108 and the first wiring pattern 107. The bump 206 and one of the plurality of posts 405 may be in contact with and be electrically connected to each of the first wiring vias 108 or each of the first wiring patterns 107 arranged on the first redistribution layer 105 among the first wiring via 108 and the first wiring pattern 107.

Upper surfaces of the plurality of posts 405 and a lower surface of the second redistribution layer 605 may be coplanar with each other. In some example embodiments, lower surface of the plurality of posts 405 and an upper surface of the first redistribution layer 105 may be coplanar with each other. In other example embodiments, lower surfaces of the plurality of posts may be provided on respective third redistribution upper pads 418, which are provided on an upper surface of the first redistribution layer 105.

The molding member 505 may surround the die 205, the shielding wall 315, and the plurality of posts 405, and fill spaces between the die 205, the shielding wall 315, and the plurality of posts 405. The molding member 505 may cover all of the side surfaces, the upper surface, and the lower surface of the die 205. The molding member 505 may surround the bump 206 and may fill a space between the lower surface of the die 205 and the upper surface of the first redistribution layer 105. The molding member 500 may include, for example, an EMC.

The second redistribution layer 605 may be located on the shielding wall 315, the shielding cover 325, and the plurality of posts 405, may include the second wiring 606, and may be electrically connected to the shielding wall 315 and the plurality of posts 405 through the second wiring 606.

The second redistribution layer 605 may include the second wiring 606 including a second wiring pattern 607 and a second wiring via 608, and a second redistribution insulating layer 609. In some embodiments, a plurality of second redistribution insulating layers 609 may be stacked. The second wiring 606 including the second wiring pattern 607 and the second wiring via 608, and the second redistribution insulating layer 609, included in the second redistribution layer 605 are substantially and respectively the same as the first wiring 106 including the first wiring pattern 111 and the first wiring via 112, and the first redistribution insulating layer 113, included in the first redistribution layer 100, and thus, repeated descriptions thereof may be omitted.

The external connection terminal 705 may include gold (Au), silver (Ag), copper (Cu), nickel (Ni), tin (Sn), lead (Pb), or a combination thereof. The external connection terminal 705 may be formed from, for example, a solder ball.

Figure 13:
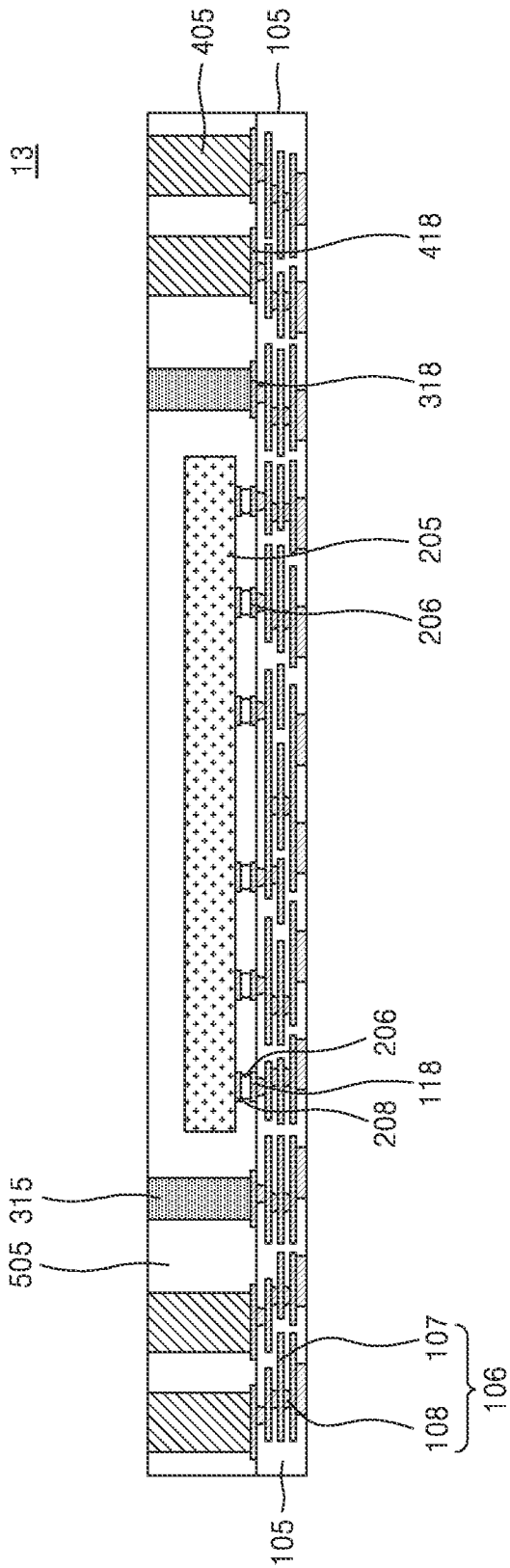
FIG. 13 is a cross-sectional view of a semiconductor package, according to example embodiments of the inventive concept.

FIG. 13 is a cross-sectional view of the semiconductor package 13 according to example embodiments of the inventive concept.

In some embodiments, the shielding wall 315, the plurality of posts 405, and an upper surface of the molding member 505 may be coplanar with each other. For example, before forming the shielding cover 325 and the second redistribution layer 605 illustrated in FIG. 12, the shielding wall 315, the plurality of posts 405, and the molding member 505 may be formed first. After forming the shielding wall 315, the plurality of posts 405, and the molding member 505, the upper surfaces of the shielding wall 315, the plurality of posts 405, and the molding member 505 may be located on the same plane through a grinding process.

Figure 14:
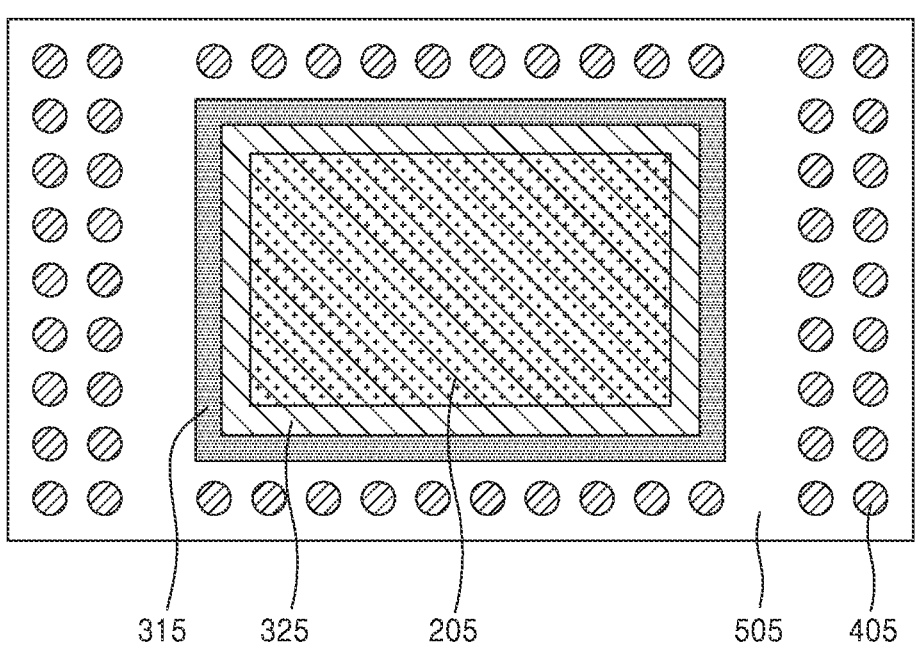
FIG. 14 is a plan view of a semiconductor package, according to example embodiments of the inventive concept.

FIG. 14 is a plan view of the semiconductor package 13 according to example embodiments of the inventive concept.

Referring to FIG. 14, a space defined by the shielding wall 315 may completely overlap a horizontal cross-section of the shielding cover 325 in a vertical direction. In some embodiments, when the space defined by the shielding wall 315 is viewed from above, the shielding cover 325 may cover all of the defined space. Areas of the upper and lower surfaces of the shielding cover 325 may be variously configured. For example, referring to FIG. 14, the areas of the upper and lower surfaces of the shielding cover 325 may be equal to or greater than an area of an exterior portion of the shielding wall 315 when viewed from above. However, the inventive concept is not limited thereto, and the areas of the upper and lower surfaces of the shielding cover 325 may be smaller than the area of the shape of the exterior portion of the shielding wall 315 viewed from above, but larger than an area of a shape of an interior portion of the shielding wall 315 viewed from above.

While the inventive concept has been particularly shown and described with reference to embodiments thereof, it will be understood that various changes in form and details may be made therein without departing from the spirit and scope of the following claims.

What is claimed is:

1. A semiconductor package comprising:
a first redistribution layer including a first wiring;
a die located on the first redistribution layer;
a shielding structure surrounding an upper surface and side surfaces of the die; and a plurality of posts disposed outside the shielding structure on the first redistribution layer, and electrically connected to the first wiring,
wherein the shielding structure comprises:
a shielding wall that is spaced apart from the side surfaces of the die and surrounds the side surfaces of the die; and
a shielding cover that is spaced apart from the upper surface of the die and surrounds the upper surface of the die,
wherein upper surfaces of the shielding wall and the plurality of posts are coplanar with each other, and
wherein the shielding cover contacts the upper surface of the shielding wall.

2. The semiconductor package of claim 1, wherein the shielding wall is spaced apart from the die and the plurality of posts and between the die and the plurality of posts.

3. The semiconductor package of claim 1, wherein a vertical level of the upper surface of the shielding wall is higher than a vertical level of the upper surface of the die.

4. The semiconductor package of claim 1, wherein at least one of the shielding wall, the shielding cover, and the plurality of posts includes copper.

5. The semiconductor package of claim 1, further comprising a molding member which covers an upper surface of the first redistribution layer on the first redistribution layer, surrounds the die, the shielding wall, and the plurality of posts, and fills a space between the die, the shielding wall, and the plurality of posts.

6. The semiconductor package of claim 5, wherein the upper surfaces of the shielding wall and the plurality of posts are coplanar with an upper surface of the molding member.

7. The semiconductor package of claim 5, further comprising a second redistribution layer which is located on the shielding wall, the shielding cover, and the plurality of posts, and includes a second wiring that is electrically connected to the shielding wall and the plurality of posts.

8. The semiconductor package of claim 7, further comprising a top package that is located on the second redistribution layer and electrically connected to the second redistribution layer.

9. The semiconductor package of claim 1, wherein the shielding wall surrounds four sides of the die, and a shape of the shielding wall viewed from above is a quadrangular shape.

10. The semiconductor package of claim 1, wherein a space defined by the shielding wall completely overlaps a horizontal cross-section of the shielding cover in a vertical direction.

11. A semiconductor package comprising:
a first redistribution layer including a first wiring;
a die located on the first redistribution layer;
a bump located between the first redistribution layer and the die and electrically connecting the die to the first wiring;
a shielding structure comprising a shielding wall that is spaced apart from side surfaces of the die and surrounds four sides of the die and a shielding cover which is spaced apart from an upper surface of the die and also surrounds the upper surface of the die, and has a flat lower surface, the shielding structure surrounding the die from the upper surface and the side surfaces of the die;
a plurality of posts located on the first redistribution layer and outside the shielding wall to be spaced apart from the shielding structure, the plurality of posts being electrically connected to the first wiring;

17 a molding member surrounding the die, the shielding wall, and the plurality of posts, and filling a space between the die, the shielding wall, and the plurality of posts;

a second redistribution layer which is located on the shielding wall, the shielding cover, and the plurality of posts, includes a second wiring, and is electrically connected to the shielding wall and the plurality of posts through the second wiring; and an external connection terminal attached below the first redistribution layer, wherein upper surfaces of the shielding wall and upper surfaces of the plurality of posts are coplanar with each other, and wherein the shielding cover contacts the upper surface of the shielding wall.

12. The semiconductor package of claim 11, wherein a space defined by the shielding wall completely overlaps a horizontal cross-section of the shielding cover in a vertical direction.

13. The semiconductor package of claim 11, wherein the upper surfaces of the shielding wall and the plurality of posts are coplanar with an upper surface of the molding member.

14. A semiconductor package comprising:

a first redistribution layer including a first wiring;

a die disposed on the first redistribution layer;

a shielding structure comprising a shielding wall that is spaced apart from side surfaces of the die and extends to continuously surround the side surfaces of the die, and a shielding cover that is spaced apart from an upper surface of the die and vertically overlaps the side surfaces of the die; and a plurality of posts disposed on the first redistribution layer to be spaced apart from the shielding structure, the plurality of posts being electrically connected to the first wiring,

wherein the shielding wall is between the plurality of posts and the die, wherein upper surfaces of the shielding wall and the plurality of posts are coplanar with each other, and wherein the shielding cover contacts the upper surface of the shielding wall.

15. The semiconductor package of claim 14, further comprising:

a second redistribution layer disposed on the shielding wall, the shielding cover, and the plurality of posts, and including a second wiring, wherein the second redistribution layer is electrically connected to the shielding wall and the plurality of posts through the second wiring.

16. The semiconductor package of claim 14, further comprising:

external connection terminals attached below the first redistribution layer.

17. The semiconductor package of claim 14, further comprising:

a molding member surrounding the die, the shielding wall, and the plurality of posts, and filling a space between the die, the shielding wall, and the plurality of posts.

18. The semiconductor package of claim 14, further comprising:

bumps between the first redistribution layer and the die, wherein the bumps electrically connect the die to the first wiring.

19. The semiconductor package of claim 14, wherein the entire lower surface of the shielding cover is flat, the entire upper surface of the shielding cover is flat, or both the entire upper surface and the entire lower surface of the shielding cover are flat.

* * * * *